United States Patent [19]

Fujii

[11] Patent Number: 5,097,313

[45] Date of Patent: Mar. 17, 1992

[54] SEMICONDUCTOR MEMORY DEVICE

[75] Inventor: Takeo Fujii, Tokyo, Japan

[73] Assignee: NEC Corporation, Tokyo, Japan

[21] Appl. No.: 676,509

[22] Filed: Mar. 28, 1991

[30] Foreign Application Priority Data

Mar. 28, 1990 [JP] Japan .................. 2-79216

[51] Int. Cl.[5] ..................... H01L 27/10; H01L 27/02; G11C 7/00
[52] U.S. Cl. ......................... 357/45; 357/41; 357/40; 357/23.6; 365/189.01
[58] Field of Search ............... 357/41, 42, 45, 23.5, 357/23.6, 40, 23.1; 365/189.01, 189.05, 189.09, 191, 220, 182

[56] References Cited

U.S. PATENT DOCUMENTS

| | | | |
|---|---|---|---|
| 4,833,518 | 5/1989 | Matsuda et al. | 357/45 |
| 4,904,887 | 2/1990 | Sugiyama et al. | 357/45 |
| 4,945,393 | 7/1990 | Belfram et al | 357/45 |
| 4,962,322 | 10/1990 | Chapman | 357/41 |

Primary Examiner—Georgia Epps
Attorney, Agent, or Firm—Sughrue, Mion, Zinn, Macpeak & Seas

[57] ABSTRACT

The semiconductor memory device according to the present invention comprises a plurality of memory cell arrays having a plurality of memory cells and a plurality of bit liens and word lines connected respectively thereto, and I/O lines which run in the direction of the word line and are connected with a given number of bit lines of the bit lines via a selection circuit, the bit lines being divided into a first and a second bit line groups of a given number of lines, the I/O lines having a first I/O line connected to a given number of lines in the first bit line group via the selection circuit and a second I/O line connected to a given number of lines in the second bit line group via the selection circuit, and the first and second I/O lines are provided to extend in opposite directions. Because of the construction as mentioned above, the arrangement and the location of the input/output pads do not affect the length of the signal line extending from the bit lines to the input/output pads, thereby preventing the data bus from becoming redundantly long and enabling high speed operations.

10 Claims, 5 Drawing Sheets

SEMICONDUCTOR MEMORY DEVICE

BACKGROUND OF THE INVENTION

The present invention relates to a semiconductor memory device, and more particularly to an arrangement of I/O lines (input/output lines) that connects the bit lines in a memory cell array with common data bus lines provided along the periphery of a semiconductor chip.

DESCRIPTION OF THE PRIOR ART

A semiconductor memory device comprises a memory cell array which includes a plurality of memory cells arranged in an array in which bit lines and word lines are respectively connected to the memory cells. A row decoder and a column decoder are arranged adjacent to said memory cell array for selecting a given memory cell. An I/O line is provided as a channel for reading data from and writing data to the memory cell selected by the row decoder and the column decoder. The I/O line is connected at one end to the bit lines via a selection switch and to the common data bus at the other end via a buffer circuit and an I/O line selection circuit, the common data bus being connected to an input/output pad which in turn is provided at the periphery of the semiconductor chip.

In a semiconductor memory device, one chip generally comprises a plurality of such memory arrays. For example, a 4 Mega bit dynamic random access memory (hereinafter referred to as DRAM) is a semiconductor memory device with the chip size of approximately 6×15 mm² which includes 16 memory cell arrays of 256 rows×1024 columns, i.e. 256 K bit, in a lateral arrangement.

By using plural memory cell arrays to shorten the bit line, capacity of the bit line can be reduced to thereby increase the speed of data read-out and write-in operations. In a memory cell array of a semiconductor memory device of such construction, the side which is parallel in the word line direction is longer than the side which is parallel in the bit line direction. Thus, when a plurality of memory cell arrays having such configuration are to be arranged, they are arranged with their longer sides adjoining one another.

When a plurality of memory cell arrays are provided, buffer circuits and I/O line selection circuits that are disposed between the common data buses and the I/O lines are also provided adjacent to the memory cell arrays in a plural number corresponding to the number of the memory cell arrays. On the other hand, signal lines that supply control signals to these buffer circuits and I/O line selection circuits are preferably small in number and shorter in length in view of signal delays or ease of wiring. The buffer circuits and the I/O line selection circuits are disposed at locations where they can be easily connected to the common control signal lines, or specifically, only on the longer side of a semiconductor chip.

With the above arrangement of the memory cell arrays, the direction of the longer side of the chip is the direction of the each bit line for the memory cell array. The I/O lines adjacent to each memory cell array run parallel to the word lines and are led out in the direction in which the buffer circuits and the I/O selection circuits are arranged, or toward one of the longer sides of the semiconductor chip. The common data buses run along one of the longer sides, and the I/O lines that are led out are connected to the common data buses via the buffer circuit and the I/O selection circuit respectively.

Each of the common data bus is connected to the input/output pad which is arranged along the periphery of the semiconductor chip via the input/output buffer circuit. Two input/output pads are provided on a longer side of the semiconductor chip in case of, for example, a DRAM of 1 M word×4 bit structure.

As mentioned above, since the I/O lines are led perpendicularly to one of the longer sides of the semiconductor chip, the common data bus that is connected to the input/output pads provided on the side of the other longer side must be extended along both the longer and the shorter sides of the chip, resulting in an inconveniently extensive length. The length of a common data bus becomes therefore highly dependent on the arrangement of the input/output pads.

In the prior art, as a common data bus can be very long depending on the positional arrangement of the input/output pads, the performance of the semiconductor memory device is restricted by the data bus with the longest wiring, hampering the implementation of a high speed operation.

BRIEF SUMMARY OF THE INVENTION

Objects of the Invention

An object of the present invention is to provide a semiconductor memory device of which data buses are not determined in length by the position of input/output pads to thereby enhance the speed of operation.

SUMMARY OF THE INVENTION

The semiconductor memory device according to the present invention comprises memory cell arrays each including plural memory cells, a plurality of bit lines and of word lines respectively connected to each memory cell wherein a predetermined memory cell is selected by a combination of a row decoder and a column decoder, and I/O lines running parallel in the direction of the word lines and connected to a given number of the plural bit lines via a selection circuit, said plural bit lines being divided into a first bit line group and a second bit line group respectively in a predetermined number of lines, the I/O lines including a first I/O line which is connected to a given number of bit lines in the first bit line group and a second I/O line which is connected to a given number of bit lines in the second bit line group respectively via selection circuits, and the first I/O line extending in the direction opposite to the direction of the second I/O line.

The first I/O line and the second I/O line are connected respectively to a first and a second common data buses via I/O line selection circuits. The first and the second common data buses are connected to input/output pads that are respectively arranged on both of the longer sides of the semiconductor chip.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
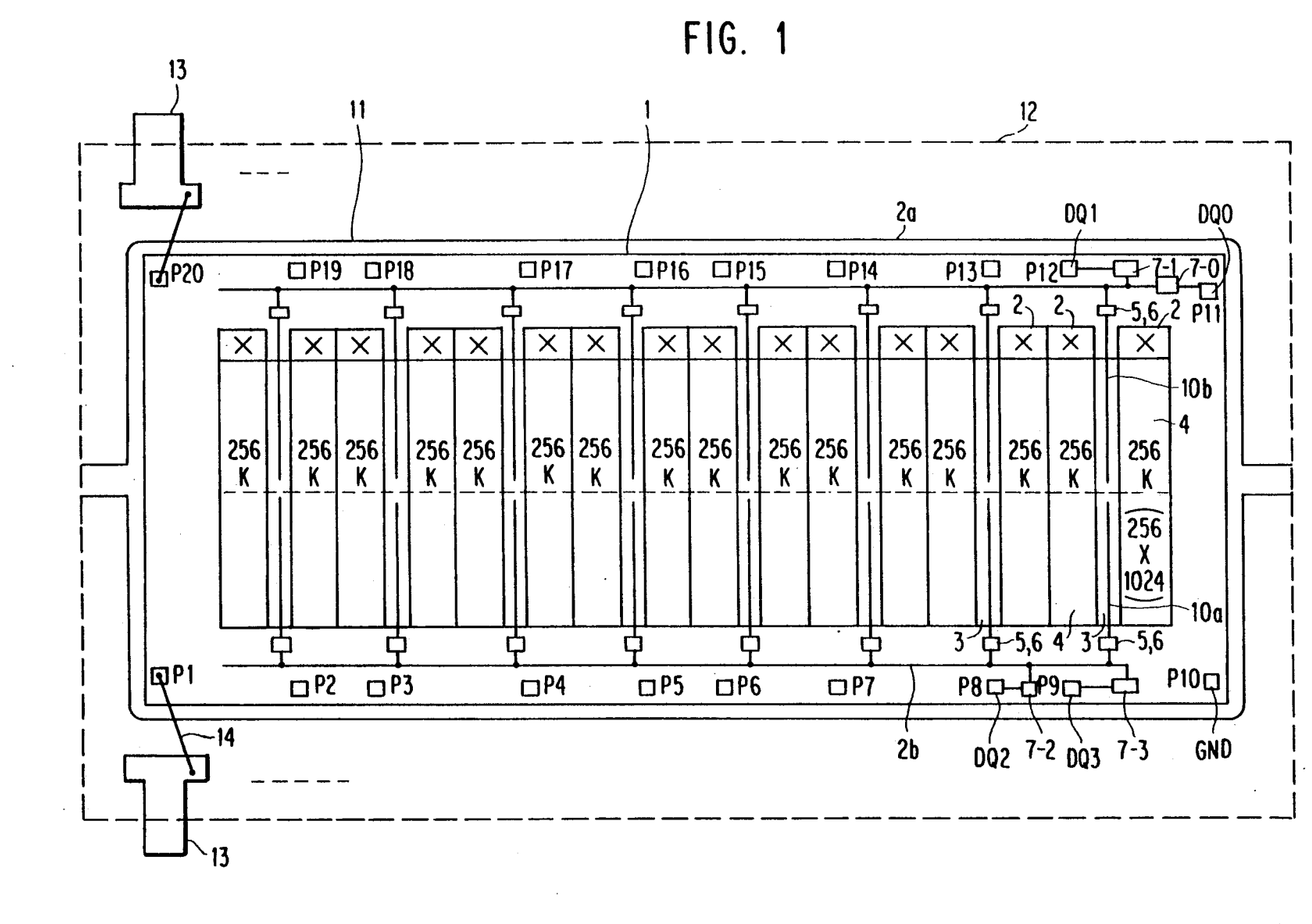
FIG. 1 is a plan view to show the entire construction of a semiconductor memory device according to the first embodiment of the present invention.

The first embodiment of a semiconductor memory device according to the present invention will now be described referring to FIG. 1. A 4 Mbit DRAM is taken up as an example. FIG. 1 is a plan view of a semiconductor chip 1 which comprises a DRAM of 1 M word × 4 bit construction on a 20-pin SOJ package. On a die-pad 11 is disposed a semiconductor chip of approximately 6 × 15 mm$^2$, on which electrode pads P1, P2, P3 ... P20 are connected respectively to external leads 13 via bonding wires 14. The semiconductor chip 1, the die-pad 11 and the external leads 13 are sealed with a resin to form an SOJ package 12 of approximately 7 × 9 mm$^2$.

A single lateral row of 16 memory cell arrays 4 each comprising 256 rows × 1024 columns, i.e. 256 Kbit, is arranged inside the semiconductor chip 1, forming a 4 Mbit memory cell array as a whole. For each of the memory cell array 4, a set of a row decoder 2 and a column decoder 3 is provided. Sides of each memory cell array 4 which run parallel to the direction of the word line are longer than the sides that run parallel to the bit line. Therefore, the memory cell arrays are arranged with their sides in the direction of the word line adjoining to one another.

As a data channel for reading-out and writing-in data in one of the memory cell arrays 4 selected by the row decoder 2 and the column decoder 3, I/O lines 10a and 10b are disposed adjacent to the array 4 in parallel with the word line. An I/O line comprises a first I/O line 10a and a second I/O line 10b which extend in opposite directions toward the two opposing longer sides of the semiconductor chip. The I/O lines 10a and 10b are connected to the bit lines via a selection switch which is controlled by the column decoder 3 within the cell array region, and further connected to either one of the common data buses 2a or 2b provided respectively along the longer sides of the chip 1 outside the cell array region but near said longer sides via a buffer circuit 5 and a I/O line selection circuit 6. The common data buses 2a and 2b are connected to the input/output pads DQ1, DQ2, DQ3 and DQ4 that are provided in the number of two on each of the opposite longer sides of the chip 1 via input/output buffers 7-0, 7-1, 7-2 and 7-3.

Figure 2:
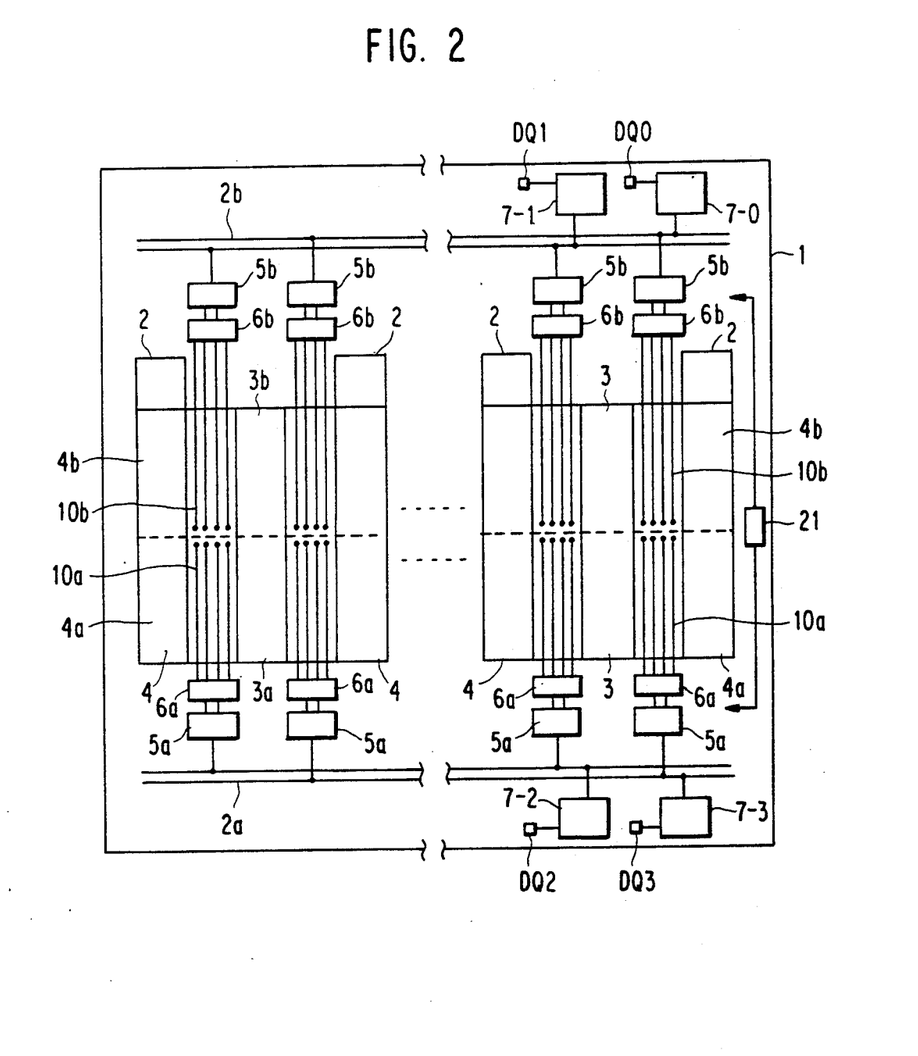
FIG. 2 is a detailed plan view to show a part of the semiconductor memory device shown in FIG. 1.

This embodiment will be described in more detail referring to FIG. 2. FIG. 2 is a partially enlarged view to show the details of the two cell arrays located on the right and left ends of the semiconductor memory device shown in FIG. 1, 14 cell arrays therebetween being omitted. The same component elements are given the same reference numbers.

Since the bit lines constituting one memory cell array 4 are divided into the first and the second groups of a given number (512 lines in this embodiment) of bit lines, the memory cell array 4 is divided into two regions of 4a and 4b. The I/O lines comprise correspondingly the first I/O lines 10a connected to the first bit line group and the second I/O lines 10b connected to the second bit line group. The first and the second I/O lines 10a and 10b each comprise two pairs of I/O line consisting of two signal lines that are complementary to each other, and extend in opposite directions from the substantial center toward the opposing longer sides of the semiconductor chip 1 in parallel to the word line of the cell array 4. These I/O lines are connected to I/O line selection circuits 6a and 6b respectively.

The I/O line selection circuits 6a, 6b connect either one of the two I/O line pairs on one end to one of the I/O line pairs at the other end depending on the control signal. The I/O pair at the other end is connected to the buffer circuit 5a or 5b. The buffer circuit 5a or 5b amplifier the potential of one of the I/O line pairs and controls supply of this amplified potential to either of the common data buses 2a or 2b (in case of read-out operation). Alternately the buffer circuit amplifies the data supplied from the common data buses 2a, 2b and transmits the same to the I/O line pairs as a set of complementary data.

The common data buses 2a, 2b each comprise two signal lines, are disposed along the two opposing longer sides of the semiconductor chip 1, and are connected with plural predetermined buffer circuits 5.

In the case of 4 bit output as in this embodiment, data input/output operations with the external device require 4 input/output pads. The input/output pads DQ0, DQ1, DQ2 and DQ3 are provided on the two opposing longer sides of the chip in the number of two. The input/output pad DQ0 is connected to one of the signal lines of the common data bus 2b via the input/output buffer 7-0. The input/output pad DQ1 is connected to the other signal line of the common data bus 2b via the input/output buffer 7-1. Similarly, the input/output pad DQ2 is connected to one of the signal lines of the common data bus 2a via the input/output buffer 7-2, and the input/output pad DQ3 to the other signal line of the common data bus 2a via the input/output buffer 7-3.

A control signal generator 21 is provided on one of the shorter sides of the semiconductor chip 1 and supplies control signals such as the one for controlling the selection operations of the I/O line selection circuits 6a, 6b provided respectively on the two opposing longer sides of the chip 1, and the one for activating the buffer circuits 5a, and 5b.

The above described construction reasonably reduces the entire length of the data line starting from the I/O lines 10a, 10b connected to the bit lines to the input/output pads DQ0, DQ1, DQ2 and DQ3 for reading and writing. In other words, the data line extending from the memory cell array 4 to the input/output pads DQ2, DQ3 provided along one of the longer sides of the semiconductor chip 1 is a channel extending from the first I/O line 10a connected to the first bit line group to the input/output pads DQ2, DQ3 via the common data bus 2a and the buffers 7-2, 7-3, and the data line extending to the input/output pads DQ0, DQ1 on the other longer side is a channel extending from the second I/O line 10b connected to the second bit line group to the input/output pads DQ0, DQ1 via the common data bus 2b and the buffers 7-0, 7-1. As the data line layout comprising these two channels is symmetric with respect to the boundary between the memory cell arrays 4a and 4b, the entire data line length for one of the input/output pad groups (e.g. DQ2 and DQ3), unlike the prior art, will not be longer than the data line for the other group (e.g. DQ0 and DQ1). Further, since the length of the I/O lines 10a, 10b corresponds to one half of the length of the side of the memory cell array 4 in the word line direction and becomes therefore half the length in the prior art, the length of the data line itself can also be reduced.

This means reduction of the data line length extending from the I/O lines connected to the bit lines to the input/output pads for reading and writing, and thus the capacity of the entire data line can be reduced, and the speed of operations of the semiconductor memory device can be increased.

As all the I/O lines in the prior art extended toward either one of the longer sides of the semconductor chip, one memory cell array required a region wide enough to accommodate 4 pairs of I/O lines, or 8 signal lines. According to the embodiment of the present invention, the first I/O line 10a and the second I/O line 10b each comprising four signal lines are provided to extend in the opposite directions, the width of the region for accommodating the I/O lines can be reduced to one half, contributing to integration of the semiconductor memory device.

As the I/O line selection circuits and the buffer circuits are provided on both of the two opposing longer sides of the semiconductor chip 1 in this embodiment, the number of lines for supplying control signals to these circuits become layer than in the prior art. However, the performance of a semiconductor memory device is determined mainly by the time involved in the data read-out, and the increase in the operational speed achieved by the reduced data line length outweighs the increased number of lines for the control signals.

Figure 3:
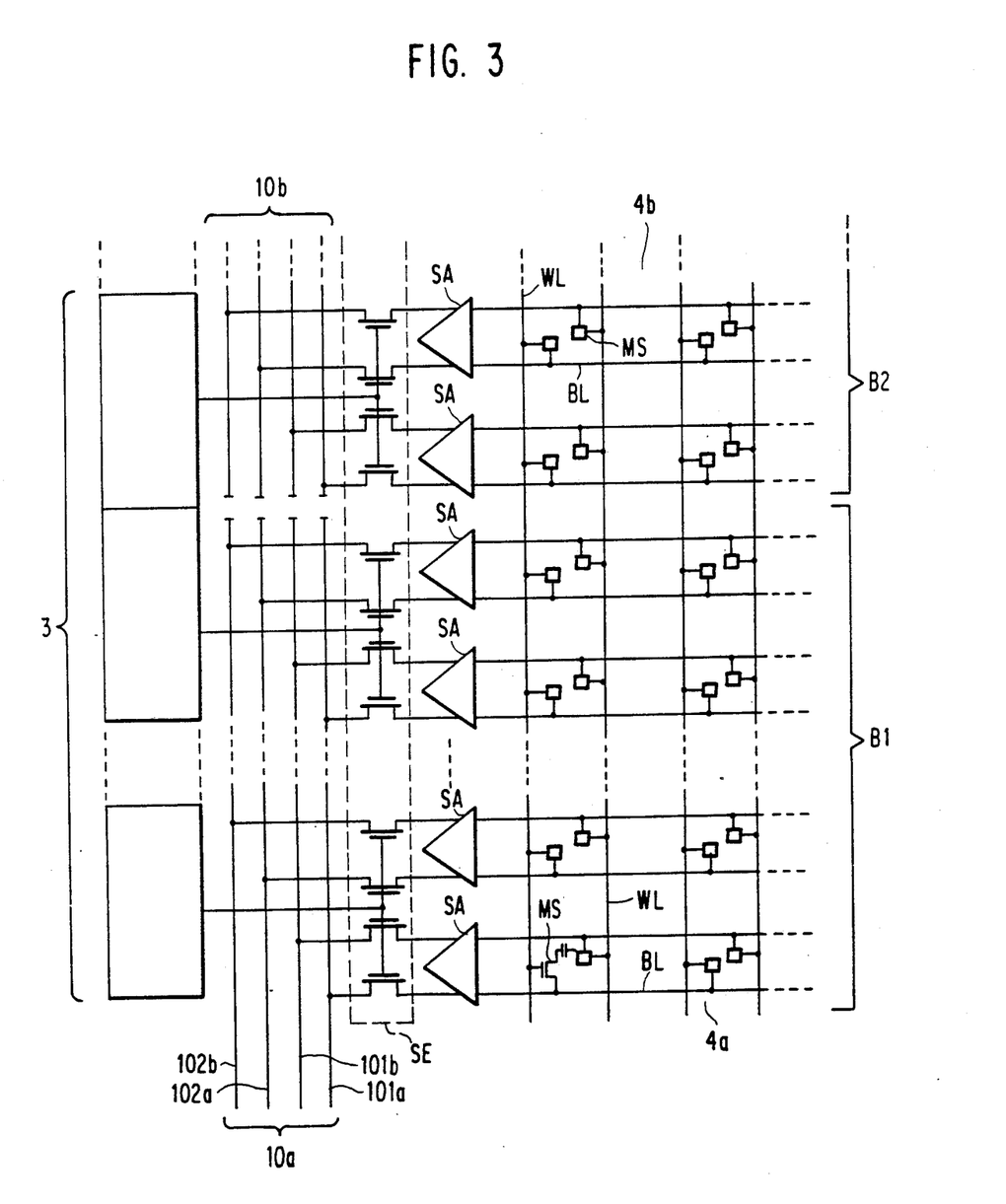
FIG. 3 is a circuit diagram to show a portion of the circuit construction of the semiconductor memory device shown in FIG. 2.
Figure 4:
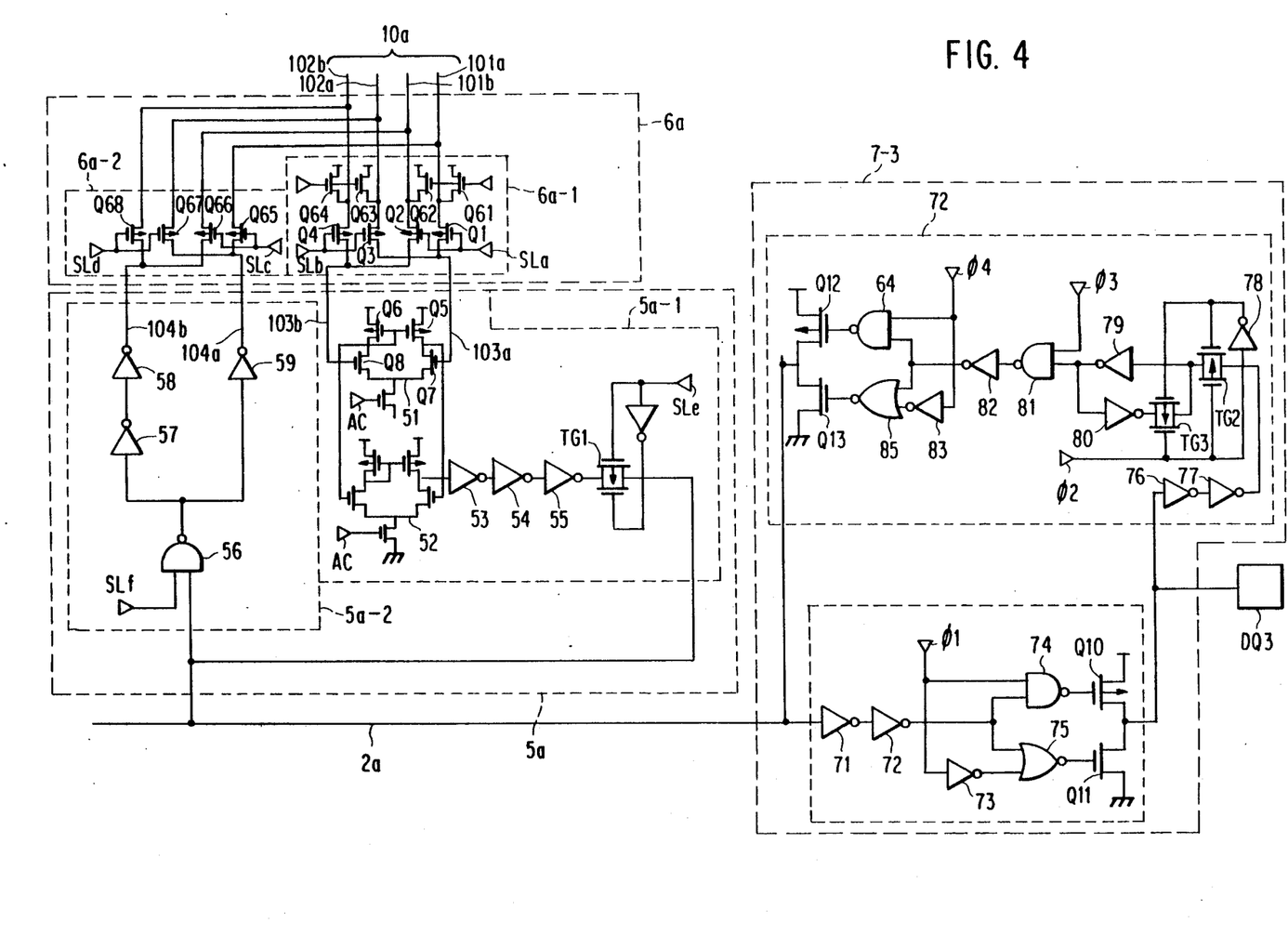
FIG. 4 is a circuit diagram to show a portion of the circuit construction of the semiconductor memory device shown in FIG. 2.

Referring to FIGS. 3 and 4, one embodiment of circuit construction shown in FIG. 2 will be explained in more detail. FIG. 3 is a circuit diagram to show the specific construction of the circuit for the memory cell array 4, a selection switch SE, and I/O lines 10a and 10b. The same component elements as in FIGS. 1 and 2 are given the same reference numbers.

The memory cell array 4 is an array of so-called one-transistor one-capacitor type cell MSs, each of which comprising one N-channel MOS transistor and one capacitor element. Total of 1024 bit lines is divided into a first bit line group B1 and a second bit line group B2 with 512 lines each, so that the memory cell array 4 is divided into two regions 4a and 4b. In each of the bit line groups Ba and B2, bit lines BL each comprising a pair of lines are connected to respective sense amplifiers SA. The row decoder 2 (FIGS. 1, 2) selects one of the word lines WL. The column decoder 3 supplies selection signals to the selection circuit SE to select two sense amplifiers SA in each of the bit line groups B1 and B2. In other words, for each one of the sense amplifiers SA, four bit line pairs are selected by the selection switch SE from plural bit line pairs connected each with two bit lines, and two pairs of them are connected to the I/O line 10a and the remaining two pairs are connected to the I/O line 10b. The selection switch SE comprises a group of transistors which receive selection signals from the column decoder via gates and whose drain-source channel is provided between the input/output terminal of the sense amplifier SA and the I/O lines 10a, 10b. Two of the four bit line pairs selected by the column decoder 3 and the selection switch SE are connected to two pairs of signal lines 101a, 101b and signal lines 102a, 102b constituting the first I/O line 10a, while the remaining two pairs are connected to the second I/O line 10b.

Referring to FIG. 4, a specific construction of the circuit including the I/O line selection circuit 6a, buffer circuit 5a, input/output buffer 7-3 on the side of the first I/O line 10a will be described. The same component elements as in FIGS. 1 and 2 are given the same reference numbers.

The I/O line selection circuit 6a includes an I/O line selection circuit 6a-1 which operates during reading-out and an I/O line selection circuit 6a-2 which operates during writing-in The I/O line selection circuit 6a-1 for reading includes transistors Q1 and Q2 which receive on gates control signal SLa from the control signal generator 21 (FIG. 2) and of which source/drain parts are provided between signal lines 101a and 103a and between signal lines 101b and 103b, and transistors Q3 and Q4 which receive on gates control signal SLb from the generator 21 and of which source/drain paths are provided between signal lines 102a and 103a and between signal lines 102b and 103b so as to select either one of the two pairs of signal lines 101a, 101b and 102a, 102b of the first I/O line 10a according to the control signals SLa, SLb and to connect the selected one with the signal line pair of 103a, 103b. It further includes pull-up transistors Q61, Q62, Q63 and Q64 for each of the signal lines 101a, 101b, 102a and 102b.

The I/O line selection circuit 6a-2 for writing includes transistors Q65 and Q66 which receive control signal SLc from the control signal generator 21 (FIG. 2) at their gates and of which source/drain paths are provided between signal lines 101a and 104a and between signal lines 101b and 104b, and transistors Q67 and Q68 which receive control signal SLd from the generator at their gates and of which source/drain paths are provides between signal lines 102a and 104a and between signal/lines 102b and 104b so as to select either one of the two pairs of signal lines 101a, 101b and 102a, 102b of the first I/O line 101 and to connect the selected one to the pair of signal lines 104a and 104b. The buffer circuit 5a includes a buffer circuit 5a-1 which operates for reading-out and a buffer circuit 5a-2 which operates for writing-in. The buffer circuit 5a-1 includes two differential circuits 51 and 52 of the same structure and three inverters 53, 54 and 55. The first differential circuit 51 includes transistors Q7 and Q8 which connects a pair of signal lines 103a, 103b to gates respectively and generates differential pair, is loaded by a current mirror circuit comprising transistors Q5 and Q6, and is activated with an activation signal AC supplied from the generator 21. The second differential circuit 52 is connected for one more stage with the first differential circuit 51, and the second differential circuit 52 is connected on one of the input/outputs thereof to an input of a transfer gate TG via the three inverter circuits for output 53, 54 and 55. The transfer gate TG1 determines by control whether or not to connect the input/output to the common data bus 2a in accordance with the control signal SLc.

The buffer circuit 51-2 for writing-in on the other hand, includes a NAND gate 56 and three inverters 57, 58 and 59. The NAND gate 56 simplifies and inverts the writing-in data supplied to the common data bus 2a in accordance with the control signal SLf supplied from the generator 21. One of the outputs from the NAND gate 56 is outputted to the signal line 104b via the inverters 57, 58 while the other output therefrom is outputted to the signal line 105a via the inverter 59. This makes the levels of the signal lines 104a and 104b complementary to one another.

The common data bus 2a is connected to the input/output pad DQ3 via an output buffer 71 and an input buffer 72 within the buffer circuit 7-3. In the output buffer 71, the output data signal is further amplified by the inverters 71 and 72, and turned into two complementary signals by the NAND gate 74 which receives as inputs the amplified signal and a control signal $\phi 1$ supplied from the control signal generator 21 and by the NAND gate 75 which receives as inputs the amplified signal and the inversion of the control signal $\phi 1$. These complementary signals are applied at the gate of a P channel transistor Q10 of which source/drain path constituting the CMOS circuit at the final output stage and connected between the power source and an output and at the gate of a N channel transistor Q11 of which source/drain path is connected between an output and the ground potential, and the output signal therefrom is supplied to an I/O pad DQ3. The output of the output buffer 71 is held at high impedance by the control signal $\phi 1$ and separated from the input/output pad DQ3 except for during reading out of data.

At the input buffer 72, the write-in data supplied at the input/output pad DQ3 is further amplified by the inverters 76 and 77. The transfer gate TG2 controls whether or not the amplified signal should be connected to a latch circuit comprising inverters 79 and 80 in accordance with the control signal $\phi 2$. As the transfer gate TG2 is turned off by the control signal $\phi 2$, the transfer gate TG3 also controlled by the signal $\phi 2$ becomes active and the write-in data is latched by the latch circuit. The latched data is further amplified by an NAND gate 81 and an inverter 82 whose outputs are controlled by a control signal $\phi 3$. The NAND gate 84 which receives as input the amplified signal and a control signal $\phi 4$ and the NAND gate 85 which receives as inputs the amplified signal and an inversion of the control signal $\phi 4$ generate two complementary signals therefrom. The complementary signals are applied at the gate of a P channel transistor Q12 whose source-drain channel constituting CMOs is connected between the power source and an output and at the gate of an N channel transistor Q13 whose source-drain channel is connected between an output and the grounded potential, and the output signals therefrom are supplied to the common data bus 2a. The output of the output buffer 72 is held at high impedance by the control signal $\phi 4$ and separated from the common data bus 2a except for during the reading-out of data.

Other buffer circuits 7-0, 7-1 and 7-2 are of the same construction as the buffer circuit 7-3, and are respectively connected to the input/output pads DQ0, DQ1, DQ2 and DQ3 whose respective input/outputs are disposed on the side of the opposing longer sides of the semiconductor chip in the unit of two.

Figure 5:
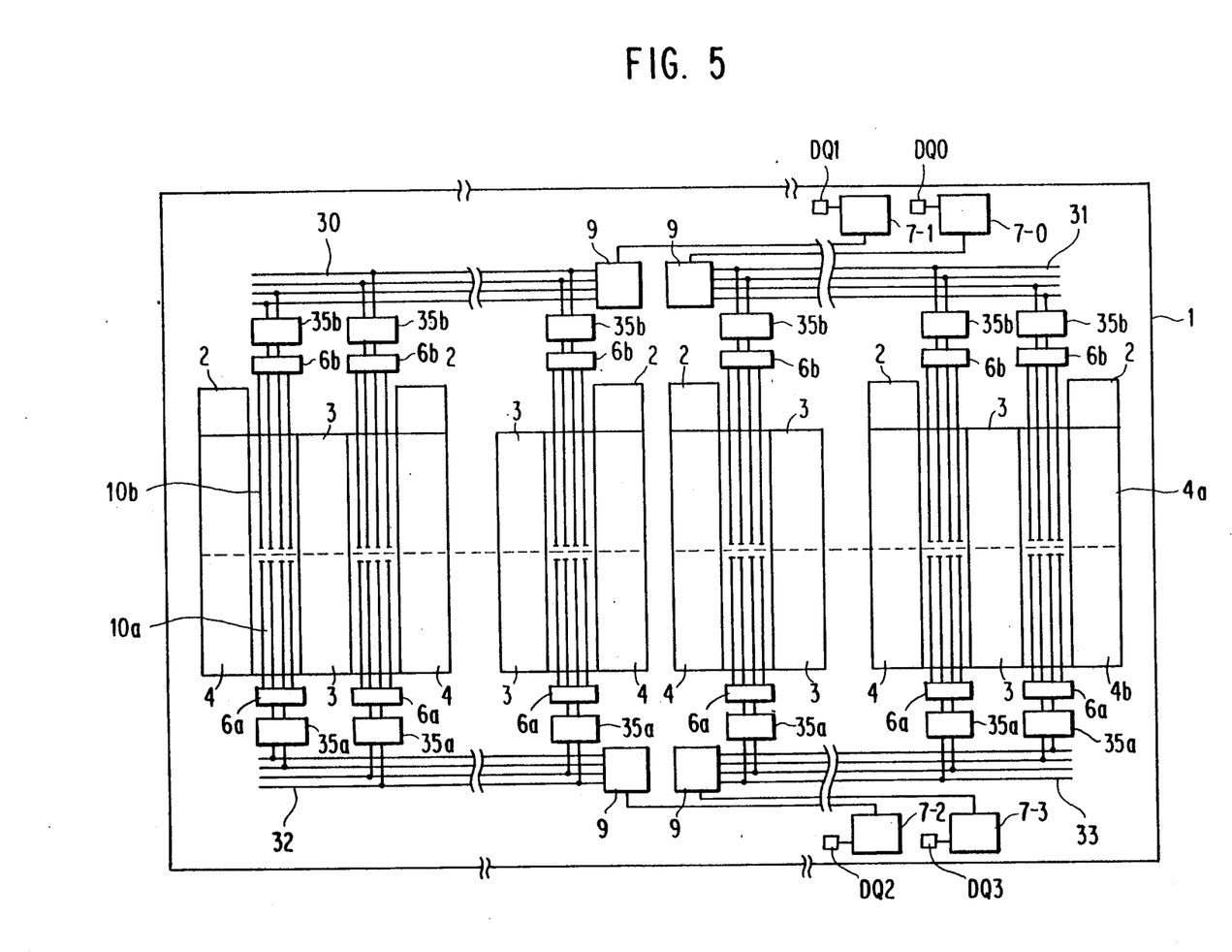
FIG. 5 is a plan view to show a portion of the construction of a semiconductor memory device according to the second embodiment of the present invention.

Referring to FIG. 5, the second embodiment of the present invention will now be described. The second embodiment differs from the first embodiment shown in FIG. 2 in that the common data buses are divided into four sets 30, 31, 32 and 33, each set comprising two complementary signal line pairs, or four signal lines, that the output signals from the buffer circuits 35a and 35b that supply signals to respective common data buses are complementary to each other, or two outputs, and that each of the common data buses 30, 31, 32 and 33 is provided with a common data bus selection circuit 9. The common data bus selection circuit 9 selects one of the two common data bus pairs that are connected thereto, amplifies one of the signals of the selected data bus and transmits the same to the buffer circuit 7. Alternately, the circuit 9 amplifies the write-in data from the buffer circuit 7 to generate complementary data, and transmits the same to the selected common data bus pair. Other features of the construction are identical with the embodiment shown in FIGS. 1 through 4.

The buffer circuits 35a and 35b may be constructed as the known two-way buffers. The common data bus selection circuit 9 may be constructed similarly to the I/O line selection circuit 6a-1 and the buffer circuit 5a-1 shown in FIG. 4, so as to enable it to select one of the two signal line pairs and to amplify the same.

According to the present invention, memory cell arrays belonging to respective input/output pads DQ0, DQ1, DQ2 and DQ3 can be distinctly blocked so that noises from the adjacent arrays during read-out can be easily dealt with.

The present invention has been described with respect to DRAM, but it is applicable to SRAM (static RAM) I/O circuit, and PROM (programmable read-only memory), EPROM (erasable PROM) and EEPROM (electrically erasable PROM) read out circuits.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor memory device comprising memory cell arrays having a plurality of memory cells, a plurality of bit lines and a plurality of word lines connected respectively thereto, and I/O lines extending in the direction of said word lines and connected with a given number of bit lines of said plural bit lines via a selection circuit, said plural bit lines being divided into a first and a second bit line groups of a given number of lines, said I/O lines having a first I/O line connected to a given number of lines in said first bit line group via said selection circuit and a second I/O line connected to a given number of lines in said second bit line group via said selection circuit, and said first and second I/O lines being provided to extend in opposite directions.

2. The semiconductor memory device as claimed in claim 1, wherein each of said first I/O line and said second I/O line has two signal line pairs each pair of which consists of two lines.

3. The semiconductor memory device as claimed in claim 1, wherein said first I/O line and said second I/O line are respectively connected to a first common data bus and a second common data bus via respective I/O line selection circuits.

4. The semiconductor memory device as claimed in claim 3, wherein said first common data bus and said second common data bus are connected to respective input/output pads that are provided on the side of the two opposing longer sides of the semiconductor chip.

5. The semiconductor memory device as claimed in claim 4, wherein said input/output pads respectively are disposed on the two opposing longer sides of the semiconductor chip in an equal number.

6. The semiconductor memory device as claimed in claim 1, wherein said first bit line group and said second bit line group are the bit lines of an equal number.

7. The semiconductor memory device as claimed in claim 4 or 5 wherein said first common data bus and said second common data bus comprise signal lines in a number equal to the number of the input/output pads that are disposed on either one of the two opposing longer sides.

8. The semiconductor memory device as claimed in claim 4 or 5 wherein said first common data and said second common data bus come in a number which is equal to the number of the input/output pads disposed on either one of the two opposing longer sides and the number of signal line pairs.

9. The semiconductor memory device as claimed in claim 3, wherein said plural memory cell arrays are arranged with their sides in the word line direction adjoining to one another, and said first I/O line and said second I/O line connected to respective memory cell arrays are connected to said first common data bus and said second common data bus via respective I/O line selection circuits.

10. The semiconductor memory device as claimed in claim 3, wherein said plural memory cell arrays are arranged with their sides in the word line direction adjoining to one another, said first I/O lines connected to a given number of memory cell arrays are connected to said first common data bus via the I/O line selection circuit, said first I/O lines that are connected to the remaining memory cell arrays are connected to the second common data bus via the I/O line selection circuit, said second I/O lines connected to a given number of said memory cell arrays are connected to a third common data bus via the I/O line selection circuit, and the second I/O lines that are connected to the remaining memory cell arrays are connected to a fourth common data bus via the I/O line selection circuit.

* * * * *